(12) United States Patent
Zhu et al.

(10) Patent No.: US 12,184,181 B2
(45) Date of Patent: Dec. 31, 2024

(54) POWER SUPPLY CIRCUIT

(71) Applicant: CHANGXIN MEMORY TECHNOLOGIES, INC., Hefei (CN)

(72) Inventors: Yuru Zhu, Hefei (CN); Yan Huang, Hefei (CN); Xinhua Cai, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 204 days.

(21) Appl. No.: 17/845,079

(22) Filed: Jun. 21, 2022

(65) Prior Publication Data

US 2023/0268840 A1 Aug. 24, 2023

Related U.S. Application Data

(63) Continuation of application No. PCT/CN2022/080884, filed on Mar. 15, 2022.

(30) Foreign Application Priority Data

Feb. 18, 2022 (CN) .......................... 202210152708.3

(51) Int. Cl.
*H02M 3/335* (2006.01)
*H02M 1/12* (2006.01)

(52) U.S. Cl.
CPC ....... *H02M 3/33523* (2013.01); *H02M 1/126* (2013.01)

(58) Field of Classification Search
CPC ........................ H02M 3/33523; H02M 1/126
See application file for complete search history.

(56) References Cited

U.S. PATENT DOCUMENTS

2006/0285365 A1* 12/2006 Huynh .............. H02M 3/33523
363/16
2010/0118567 A1 5/2010 Liu
(Continued)

FOREIGN PATENT DOCUMENTS

CN 101350557 A 1/2009
CN 201699598 U * 1/2011
(Continued)

OTHER PUBLICATIONS

"VIPer12A power switching power supply IC5", Goston Electronics Co., Ltd, 2018(05), https://max.book118.com/html/2018/0510/165755114.shtm, 11 pages.

*Primary Examiner* — Jue Zhang
(74) *Attorney, Agent, or Firm* — Syncoda LLC; Feng Ma

(57) ABSTRACT

A power supply circuit includes: power supplying module configured to provide DC voltage; transformer module including primary-side first winding connected to power supplying module and secondary-side winding coupled to primary-side first winding; switch module having one end connected to primary-side first winding and the other end connected to grounding terminal; control module connected to switch module, where control module is configured to control switch module to have different switching frequencies and/or different turning-off times, to enable first pulse voltages with different duty cycles to be formed on primary-side first winding, and second pulse voltages with different duty cycles to be subsequently generated on secondary-side winding; and voltage conversion module having input terminal connected to secondary-side winding and output terminal connected to voltage output terminal of power supply circuit, where voltage conversion module is configured to convert second pulse voltages with different duty cycles on secondary-side winding into respective DC voltages.

13 Claims, 4 Drawing Sheets

(56) References Cited

U.S. PATENT DOCUMENTS

| | | | |
|---|---|---|---|
| 2012/0195076 A1 | 8/2012 | Zhang | |
| 2012/0250366 A1* | 10/2012 | Wang | H02M 3/33523 |
| | | | 363/21.15 |
| 2015/0293822 A1* | 10/2015 | Chun | G11C 29/08 |
| | | | 714/6.13 |
| 2016/0315543 A1 | 10/2016 | Zhang et al. | |
| 2020/0412231 A1* | 12/2020 | Khamesra | H02M 1/32 |

FOREIGN PATENT DOCUMENTS

| | | |
|---|---|---|
| CN | 102624237 A | 8/2012 |
| CN | 202906767 U | 4/2013 |
| CN | 108258907 A | 7/2018 |
| CN | 210835771 U | 6/2020 |
| JP | 2000014141 A | 1/2000 |

\* cited by examiner

POWER SUPPLY CIRCUIT

CROSS-REFERENCE TO RELATED APPLICATIONS

This application is a continuation of International Application No. PCT/CN2022/080884, filed on Mar. 15, 2022, which claims priority to Chinese Patent Application No. 202210152708.3, filed on Feb. 18, 2022. The disclosures of International Application No. PCT/CN2022/080884 and Chinese Patent Application No. 202210152708.3 are hereby incorporated by reference in their entireties.

BACKGROUND

A system platform testing process for memory devices such as DRAM typically involves a variety of system platforms. Each system platform requires a power supply that conforms to its specifications to supply power to it, and different system platforms have power supplies of different specifications.

At present, power supply circuits used in testing on system platforms usually output only one power supply voltage, thereby bringing inconvenience to the testing on the system platforms.

SUMMARY

The present disclosure relates to a technical field of system power supplies, and in particular to, a power supply circuit.

According to various embodiments of the present disclosure, a power supply circuit is provided.

According to various embodiments of the present disclosure, there is provided a power supply circuit, including: a power supplying module configured to provide a first direct current (DC) voltage; a transformer module, including a primary side first winding connected to the power supplying module and a secondary side winding coupled to the primary side first winding; a switch module having one end connected to the primary side first winding and the other end connected to a grounding terminal; a control module, connected to the switch module, wherein the control module is configured to control the switch module to have different switching frequencies and/or different turning-off times, to enable first pulse voltages with different duty cycles to be formed on the primary side first winding, and second pulse voltages with different duty cycles to be subsequently generated on the secondary side winding; and a voltage conversion module having an input terminal connected to the secondary side winding and an output terminal connected to a voltage output terminal of the power supply circuit, wherein the voltage conversion module is configured to convert the second pulse voltages with different duty cycles on the secondary side winding into respective DC voltages.

Details of one or more embodiments of the present disclosure are set forth in the following drawings and description. Other features, objects and advantages of the present disclosure will become apparent from the specification, drawings and claims.

BRIEF DESCRIPTION OF THE DRAWINGS

In order to more clearly illustrate the technical solutions of the embodiments of the present disclosure or the conventional technology, the accompanying drawings required for the description of the embodiments or the conventional technology will be briefly described below. It will be apparent that the accompanying drawings in the following description are merely some embodiments of the present disclosure, and other drawings may be drawn from these drawings by those of ordinary skill in the art without creative efforts.

LIST OF REFERENCE NUMERALS

Figure 1:
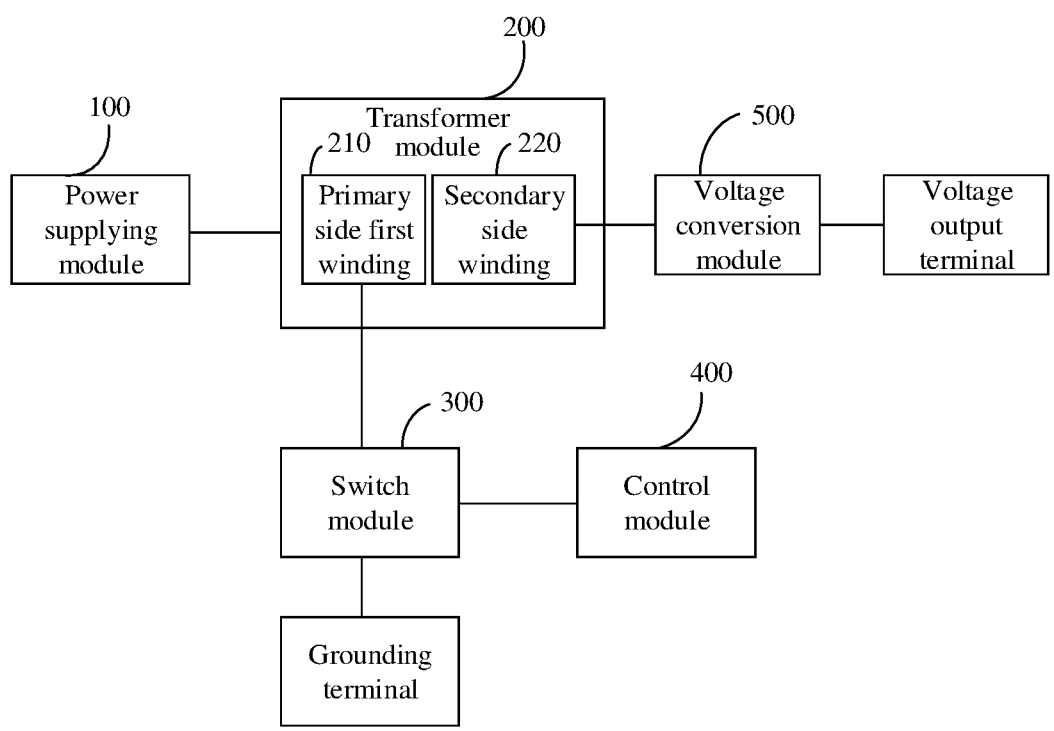
FIG. 1 is a block diagram of a power supply circuit according to an embodiment.

100—power supplying module, 110—first rectifying unit, 120—first filtering unit, 200—transformer module, 210—primary side first winding, 220—secondary side winding, 230—primary side second winding, 300—switch module, 400—control module, 500—voltage conversion module, 510—second rectifying unit, 520—second filtering unit, 600—comparison module, 610—reference unit, 611—voltage regulator, 620—feedback unit, 621—transmitter, 622—receiver, 700—anti-shock module.

For better description and explanation of the embodiments and/or examples of those disclosure disclosed herein, reference may be made to one or more of the drawings. Additional details or examples used to describe the drawings should not be construed as limiting the scope of any of the disclosed inventions, the presently described embodiments and/or examples, and the presently understood best mode of these inventions.

DETAILED DESCRIPTION

To facilitate the understanding of the present disclosure, the present disclosure will be described more fully below with reference to the related drawings. Embodiments of the present disclosure are shown in the drawings. However, the present disclosure may be implemented in many different forms and is not limited to the embodiments described herein. Rather, these embodiments are provided in order to make the disclosure more thorough and comprehensive.

Unless otherwise defined, all technical and scientific terms used herein have the same meanings as generally understood by those skilled in the art belonging to the present disclosure. The terms used herein are for the purpose of describing embodiments of the present disclosure only and are not intended to limit this disclosure.

It is to be understood that the terms "first" "second" and so on used in this disclosure may be used herein to describe various elements, but these elements are not limited by these terms. These terms are only used to distinguish the first element from the other element.

It should be noted that when an element is considered to be "connected" to another element, it may be directly connected to another element or connected to another element by an intervening element. Furthermore, "connection" in the following embodiments should be understood as "electrical connection", "communication connection", etc. if there is electrical signal transmission or data transmission between the objects that are connected to each other.

As used herein, the singular forms "a" "an" and "the/this" can include the plural forms as well, unless the context clearly dictates otherwise. It should also be understood that the term "include/contain" or "have" etc., specifies the presence of stated features, integers, steps, operations, components, portions, or combinations thereof, but does not rule out the possibility of the presence or addition of one or more other features, integers, steps, operations, components, portions, or combinations thereof. Furthermore, the term "and/or" as used in this description includes any and all combinations of related listed items.

As mentioned in the background, in the prior art, the power supply circuits used in testing on system platforms usually output only one type of power supply voltage, thereby bringing inconvenience to the testing on the system platforms.

Specifically, for example, when batch system verification is performed on DRAMs, the power-on test of the system board requires manual connection to a power adapter. The startup codes of the system board start to run after the power is turned on, and it takes some time from manually power on to operating the computer, which may cause the engineer to miss modifying the parameters of the DRAM.

Furthermore, different system platforms require power supplies of different specifications, and interleaved dense power supply lines are susceptible to being mistakenly touched. Moreover, the strong electrical environment of the power supplies easily causes electromagnetic radiation, which affects the test results of the system verification of the DRAMs.

For the above reasons, embodiments of the present disclosure provide a power supply circuit capable of intelligently outputting multiple power supply voltages.

Referring to FIG. 1, there is provided a power supply circuit including a power supplying module 100, a transformer module 200, a switch module 300, a control module 400, and a voltage conversion module 500.

The power supplying module 100 is configured to provide a first DC voltage Ui.

The transformer module 200 includes a primary side first winding 210 and a secondary side winding 220. The primary side first winding 210 is connected to the power supplying module 100. The secondary side winding 220 is coupled to the primary side first winding 210, and the voltage of the secondary side winding varies with the voltage of the primary side first winding 210.

One end of the switch module 300 is connected to the primary side first winding 210, and the other end of the switch module 300 is connected to the ground terminal GND; the switch module is configured to connect or disconnect the primary side first winding 210 and the ground terminal GND.

When the switch module 300 connects the primary side first winding 210 and the ground terminal GND, charges from the power supplying module 100 flow though the primary side first winding 210 and then flow into the ground, so that the voltage on the primary side first winding 210 has a value of 0 V. When the switch module 300 disconnects the primary side first winding 210 from the ground terminal GND, the first DC voltage Ui from the power supplying module 100 is supplied to the primary side first winding 210, that is, the voltage on the primary side first winding 210 is the first DC voltage Ui.

As an example, the switch module 300 may include a switch transistor. The type of the switch transistor may be P-type or N-type. Of course, the switch module 300 may be provided in other forms as long as it can connect and disconnect the primary side first winding 210 and the ground terminal GND.

The control module 400 is connected to the switch module 300, and is configured to control the switches of the switch module 300.

Specifically, when the switch module 300 includes the switch transistor, the control module 400 may control the connection and disconnection of a source and a drain of the switch transistor by inputting a corresponding level signal to a gate of the switch transistor, thereby controlling the switching of the switch module 300. For example, when the switch module 300 is an N-type transistor, the control module 400 may turn on the switch module 300 by inputting a high level signal to the gate of the switch transistor, or may turn off the switch module 300 by inputting a low level signal to the gate of the switch transistor. For another example, when the switch module 300 is a P-type transistor, the control module 400 may turn on the switch module 300 by inputting a low level signal to the gate of the switch transistor, or may turn off the switch module 300 by inputting a high level signal to the gate of the switch transistor.

Furthermore, the control module 400 is configured to control the switch module 300 to have different switching frequencies and/or different turning-on times such that first pulse voltages with different duty cycles are formed on the primary side first winding 210. When the first pulse voltages with different duty cycles are formed on the primary side first winding 210, second pulse voltages with different duty cycles are subsequently generated on the secondary side winding.

Specifically, the control module 400 controls the switch module 300 to continuously turn on and turn off, thereby continuously connecting and disconnecting the primary side first winding 210 and the ground terminal GND, so that the first pulse voltages are formed on the primary side first winding 210 of the transformer module 200, and subsequently the second pulse voltages after the voltage conversion are formed on the secondary side winding 220 of the transformer module 200.

When the control module 400 controls the switch module 300 to turn on and turn off at a certain frequency, a first pulse voltage with the frequency is formed on the primary side first winding 210 of the transformer module 200, and subsequently a second pulse voltage with the frequency after the voltage conversion is also formed on the secondary side winding 220 of the transformer module 200.

When the control module 400 controls the switch module 300 to turn on and turn off at different frequencies, the first pulse voltages with different frequencies are formed on the primary side first winding 210 of the transformer module 200, and subsequently the second pulse voltages with different frequencies after the voltage conversion are subsequently formed on the secondary side winding 220 of the transformer module 200.

When the control module 400 controls the switch module 300 to turn on, the primary side first winding 210 of the transformer module 200 is grounded, and the voltage of the first pulse voltage formed thereon has a value of 0 V, and the voltage of the second pulse voltage formed on the secondary side winding 220 of the transformer module 200 also has a value of 0 V. When the control module 400 controls the switch module 300 to turn off for a certain turning-off time, the first DC voltage Ui from the power supplying module 100 is supplied to the primary side first winding 210 of the transformer module 200 during the turning-off time. The voltage of the first pulse voltage formed on the primary side first winding 210 during the turning-off time has a value same as the value of the first DC voltage Ui, and the voltage of the second pulse voltage formed on the secondary side winding 220 of the transformer module 200 has a value same as the value of the first DC voltage Ui after the voltage conversion.

Therefore, the control module 400 controls the turning-off time of the switch module 300, so that the power-on time of the primary side first winding 210 and the secondary side winding 220 of the transformer module 200 can be controlled.

Furthermore, the duty cycle of the pulse voltage is equal to the product of the frequency of the pulse and the power-on time. Thus, the control module 400 controls the switch module 300 to have different switching frequencies and/or different turning-off times, such that first pulse voltages with different duty cycles are formed on the primary side first winding 210. The second pulse voltages with different duty cycles are subsequently generated on the secondary side winding.

Figure 2:
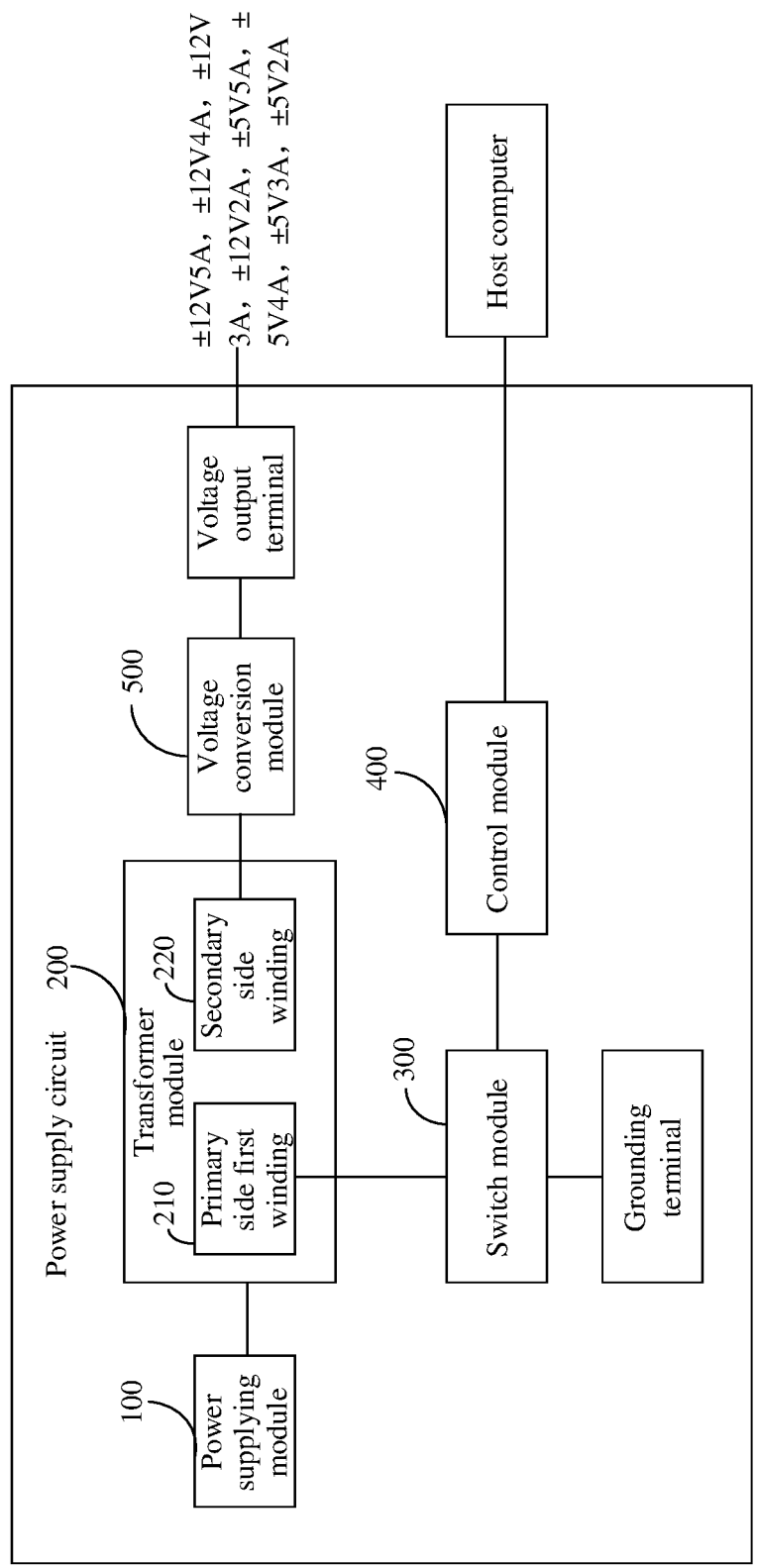
FIG. 2 is a schematic diagram of an application process of a power circuit according to an embodiment.

Specifically, referring to FIG. 2, when the power supply circuit is applied, the control module 400 of the power supply circuit may be communicatively connected to the host computer. The host software may send an operation command to the control module 400 of the power supply circuit. The control module 400 may control the switch module 300 to have different turning-off times at a fixed switching frequency according to different operation commands, or may control the switch module 300 to have different switching frequencies for a fixed turning-off time, or may simultaneously control the switch module 300 to have different switching frequencies and different turning-off times. In this way, second pulse voltages with different duty cycles are generated on the secondary side winding 220, thereby outputting multiple different DC power supply voltages at the voltage output terminal of the power supply circuit.

The input terminal of the voltage conversion module 500 is connected to the secondary side winding 220, and the output terminal of the voltage conversion module 500 is connected to the voltage output terminal of the power supply circuit; and the voltage conversion module 500 is for converting the second pulse voltages with different duty cycles on the secondary side winding 220 into DC voltages.

The voltage conversion module 500 may convert the second pulse voltages with different duty cycles into DC voltages having different voltage values. The voltage output terminal of the power supply circuit may output voltages such as ±12V5A, ±12V4A, ±12V3A, ±12V2A, ±5V5A, ±5V4A, ±5V3A, and ±5V2A.

In the present embodiments, the primary side first winding of the transformer module 200 is configured to be connected to the power supplying module 100, and further connected to the switch module 300 with the other end grounded; furthermore, the control module 400 is configured to control the switch module 300 to have different switching frequencies and/or different switching times, so that second pulse voltages with different duty cycles are formed on the secondary side winding of the transformer module 200. The voltage conversion is performed on the second pulse voltages with different duty cycles by the voltage conversion module 500, so that the voltage output terminal of the same power supply circuit can effectively output multiple power supply voltages.

In an embodiment, the power supply circuit is configured to implement power supplying in a manner of single-input multiple-output to system platforms for testing a DRAM.

In this case, when the system platform test on the DRAM is performed by using the power supply circuit of the present embodiments, the testing can be greatly facilitated. For example, the power-on test of the system board no longer requires manual connection to the power adapter. Furthermore, since the voltage output terminal of the same power supply circuit can effectively output multiple power supply voltages, only one power supply line is required to be connected to the power supply circuit, so that the power supply line can be effectively prevented from being accidentally touched, and electromagnetic radiation caused by the strong electrical environment can be effectively prevented.

It is to be noted herein that in other embodiments of the present disclosure, the power supply circuit is not limited to implement power supplying in a manner of single-input multiple-output to system platforms for testing a DRAM.

Figure 3:
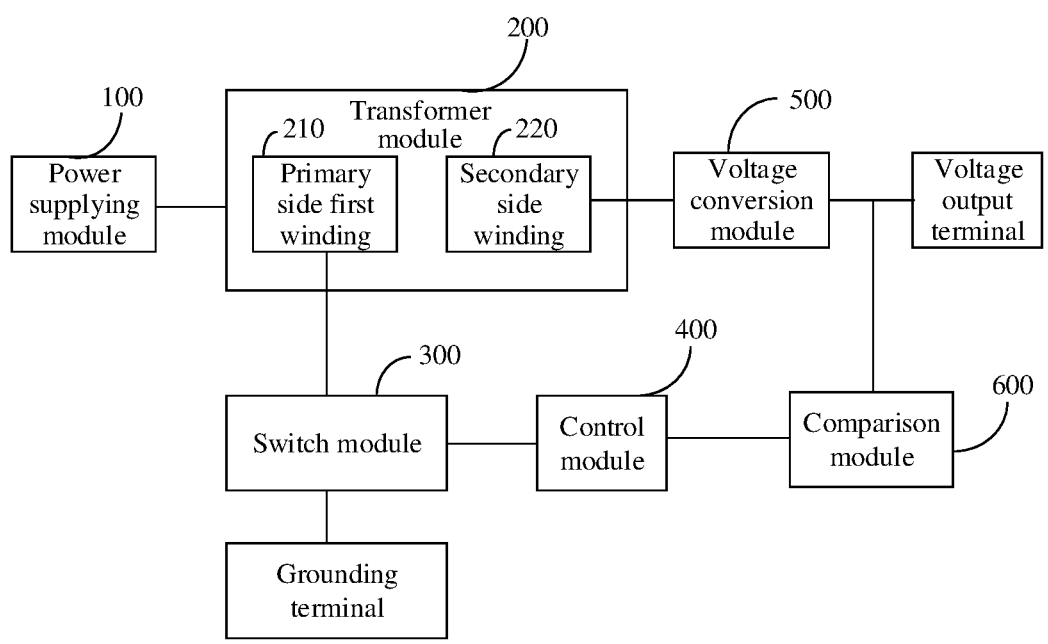
FIG. 3 is a block diagram of a power supply circuit according to another embodiment.

In an embodiment, referring to FIG. 3, the power circuit further includes a comparison module 600. The comparison module 600 is connected to the voltage output terminal of the power supply circuit and the control module 400, and is configured to compare each actual voltage output from the voltage output terminal with a respective target voltage, and feedback a comparison result to the control module 400.

Specifically, the comparison module 600 may be directly electrically connected to the voltage output terminal of the power supply circuit, or may be connected to the voltage output terminal of the power supply circuit through other elements. There are no limits to the comparison module 600.

When the comparison module 600 is directly electrically connected to the voltage output terminal of the power supply circuit, the comparison module 600 may directly compare the voltage at the voltage output terminal of the power supply circuit with the corresponding target voltage, thereby generating a comparison result.

When the comparison module 600 is connected to the voltage output of the power supply circuit through other elements, some voltage conversion calculations may be involved.

Figure 4:
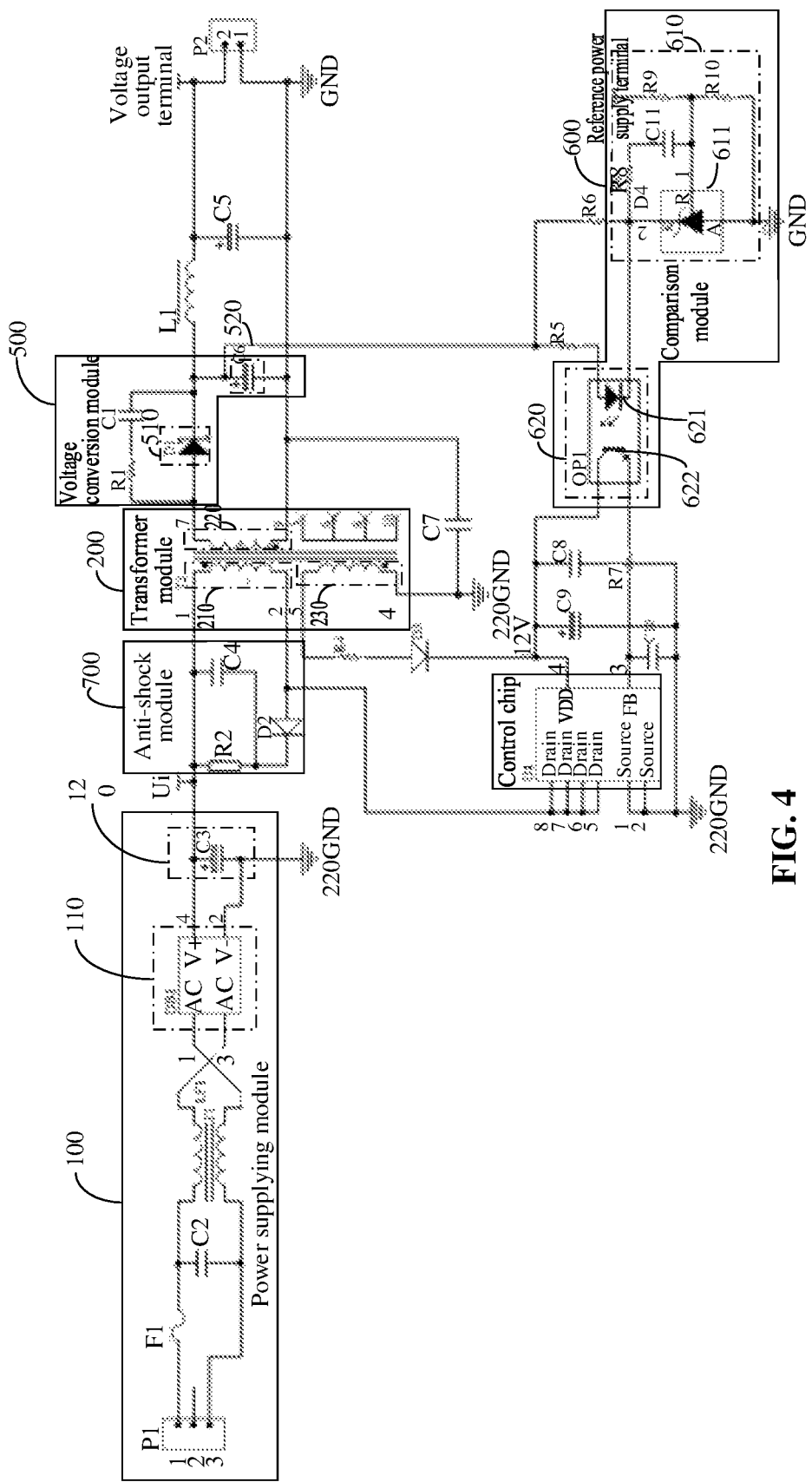
FIG. 4 is a circuit diagram of a power supply circuit according to an embodiment.

Specifically, referring to FIG. 4, a resistor R5 and an inductor L1 may be disposed between the comparison module 600 and the voltage output terminal of the power supply circuit. The inductor L1 and the capacitor C5 constitute a filter circuit that can lower the DC voltage ripple output from the voltage output terminal. Furthermore, the resistor R5 has a current limiting function to prevent the DC voltage from the voltage conversion module 500 from being directly input to the comparison module 600, thereby avoiding overcurrent damage to the components in the comparison module 600.

In this case, the comparison module 600 is connected to the voltage output terminal through the resistor R5 and the inductor L1, and it is necessary to consider a voltage drop caused by the resistor R5 and the inductor L1. Therefore, the voltage conversion calculation can be performed on the target voltage to be output at the voltage output terminal of the power supply circuit to obtain a corresponding converted voltage. Specifically, the converted voltage may be a voltage formed by voltage division of various target voltages to be output from the voltage output terminal of the power supply circuit, through the inductor L1 and the resistor R5.

When the comparison is performed by the comparison module 600, the two actual voltages to be compared may be: the voltage formed by voltage division of the actual voltage output from the voltage output terminal through the inductor L1 and the resistor R5, and the corresponding converted voltage obtained after the target voltage to be output is subjected to voltage conversion calculation, thereby realizing comparison between each actual voltage output from the voltage output terminal with a respective target voltage. The comparison module 600 generates a comparison result according to the comparison of the above two voltages.

The control module 400 adjusts the switching frequency and/or the turning-off time of the switch module 300 according to the comparison result, thereby adjusting the duty cycle of the second pulse voltage of the transformer module 200, and adjusting the voltage output from the voltage output terminal of the power supply circuit.

Specifically, for example, when the actual voltage output from the power supply output is too low, the control module 400 may control the turning-off time of the switch module 300 so that the power-on time of the transformer module 200 becomes longer, thereby increasing the output voltage.

In this embodiment, by setting the comparison module 600, the switching frequency and/or the turning-off time of the switch module 300 can be adjusted more effectively according to the actual voltage output from the voltage output terminal, so that the final output voltage can be more accurate.

In an embodiment, referring to FIG. 4, the comparison module 600 includes a reference unit 610 and a feedback unit 620.

The reference unit 610 generates multiple reference voltages. Each reference voltage is associated with a respective target voltage. Each of the reference voltages is used for determining, through comparison, whether the actual voltage output from the voltage output terminal is the corresponding target voltage.

The value of the reference voltage may vary depending on the form of the circuit arrangement between the comparison module 600 (specifically, the feedback unit 620) and the voltage output terminal of the power supply circuit.

When the feedback unit 620 is directly electrically connected to the voltage output terminal of the power supply circuit, the reference voltage may be determined according to the target voltage to be output at the voltage output terminal. When the feedback unit 620 is connected to the voltage output terminal of the power supply circuit through other elements, the reference voltage may be determined according to the corresponding converted voltage obtained after the target voltage to be output from the voltage output terminal is subjected to the voltage conversion calculation.

The feedback unit 620 is connected to the voltage output terminal of the power supply circuit, the reference unit 610, and the control module 400, and is configured to generate a feedback signal according to the actual voltage output from the voltage output terminal and the corresponding reference voltage generated by the reference unit.

When the feedback unit 620 is directly electrically connected to the voltage output terminal of the power supply circuit, the feedback unit 620 can directly compare the actual voltage output from the voltage output terminal with the corresponding target voltage by comparing the actual voltage output from the voltage output terminal with the corresponding reference voltage generated by the reference unit.

When the feedback unit 620 is connected to the voltage output terminal of the power supply circuit through other elements, the feedback unit 620 can compare the voltage formed after voltage division (that is, the voltage formed by voltage division of the actual voltage output from the voltage output terminal by other elements) with the corresponding reference voltage generated by the reference unit, thereby achieving comparison between the voltage formed after voltage division (that is, the voltage formed by voltage division of the actual voltage output from the voltage output terminal by other elements) and the corresponding converted voltage (obtained after the target voltage to be output from the voltage output terminal is subjected to the voltage conversion calculation), thus achieving comparison between the actual voltage output from the voltage output terminal and the corresponding target voltage.

The control module 400 adjusts the switching frequency and/or the off time of the switch module 300 according to the feedback signal.

In the embodiment, the voltage output from the voltage output terminal of the power supply circuit can be accurately and reliably adjusted by generating a real reference voltage (analog signal).

Of course, in other embodiments, the reference unit 610 configured to generate the real reference voltage (analog signal) may not be provided. For example, in this case, the comparison module 600 may be configured to acquire the actual voltage at the output terminal of the power supply circuit and convert the acquired actual voltage into a digital signal, and compare the digital signal with the reference voltage stored therein. Thus, the switching frequency and/or the off time of the switch module 300 can be adjusted according to the comparison result.

In an embodiment, referring to FIG. 4, the feedback unit 620 includes an optocoupler device. The optocoupler device includes a transmitter 621 and a receiver 622. Both ends of the transmitter 621 are respectively connected to the voltage output terminal and the reference unit 610, and the receiver 622 is connected to the control module 400.

Specifically, the transmitter 621 may be a light emitting diode (LED). The receiver 622 may be a transistor.

The cathode of the LED is configured to receive the reference voltage provided from the reference unit 610. The anode of the LED is configured to receive the actual voltage output from the voltage output terminal. When the actual voltage output from the voltage output terminal is too large, which causes the voltage at the anode of the LED to be too large, the optocoupler device is turned on, and the voltage (feedback signal) of the emitter of the transistor of the optocoupler device is increased and then the voltage (feedback signal) is fed back to the control module 400. The control module 400 then controls the switching frequency and/or the turning-off time of the switch module according to the voltage (feedback signal), so that the input voltage of the primary side first winding 210 of the transformer module 200 is reduced, thereby achieving the purpose of adjusting the input voltage of the transformer module 200 according to the feedback of the voltage output by the transformer module 200.

In this case, information can be transmitted through the optical signal, so that the insulation and isolation is realized between the voltage output terminal and the control module 400, thereby making the circuit safer.

In an embodiment, the reference unit 610 includes a reference power supply terminal and a voltage conversion sub-unit.

The reference power terminal is configured to provide a power supply to the reference unit 610. The voltage conversion sub-unit is connected to the reference power supply terminal and the feedback unit 620, and configured to convert the power supply voltage provided from the reference power supply terminal into multiple reference voltages and output the multiple reference voltages to the feedback unit 620.

As an example, the voltage conversion sub-unit includes a voltage regulator 611, a first resistor R9, a second resistor R10, a third resistor R8, and a capacitor C11.

The voltage regulator has a control terminal K, a sampling terminal R, and a ground terminal A. The control terminal K is connected to the feedback unit 620. The sampling terminal R is connected to the first resistor R9 and the second resistor R10.

One end of the first resistor R9 is connected to the reference power supply terminal, and the other end of the first resistor R9 is connected to the sampling terminal R of the voltage regulator 611.

One end of the second resistor R10 is connected to the sampling terminal R of the voltage regulator 611, and the other end of the second resistor R10 is grounded.

One end of the third resistor R8 is connected to the control terminal K of the voltage regulator 611, and the other end of the third resistor R8 is connected to the capacitor C11.

One end of the capacitor C11 is connected to the third resistor R8, and the other end of the capacitor C11 is connected to the sampling terminal R of the voltage regulator 611.

R8 is a current limiting resistor, and the resistance selected for R8 is calculated according to the actually required output current and input voltage. The higher the input voltage, the greater the resistance of R8 should be. The larger the output current, the smaller the resistance of R8 should be. R8 and C11 constitute an absorption loop to prevent self-excited oscillation.

The voltage conversion subunit may set the reference voltage by controlling the two resistors R9 and R10. For example, a voltage from 2.5 V to 12 V are arbitrarily set to by controlling the two resistors R9 and R10. The voltage value calculation formula is Vout=(R9+R10)*2.5/R10.

Furthermore, the resistance of R8 should satisfy the relationship: 1 mA<(Vcc−Vout)/R8<500 mA, where Vcc is the power supply voltage supplied by the reference power supply terminal of the reference unit 610.

In addition, the reference unit 610 may further include a resistor R6. The resistor R6 also serves as a current limiting means to prevent the DC voltage from the voltage conversion module 500 from being directly input to the K terminal of the voltage regulator 611, which will damage the device when the current is too large. Furthermore, the current limiting resistor R6 can be selected in such a way that the minimum current flowing through the voltage conversion sub-unit is greater than 1 mA, thereby preventing loss of the voltage regulation performance, while the maximum current flowing through the voltage conversion sub-unit is not more than 100 mA, thereby preventing damage to the devices in the voltage conversion sub-unit.

In an embodiment, referring to FIG. 4, the switch module 300 and the control module 400 are disposed on a same control chip U1 to facilitate integrated control.

Specifically, the switch module 300 may be a field effect transistor (FET) inside the control chip U1. The source of the field effect transistor may be connected to a ground terminal. The drain of the field effect transistor may be connected to the primary side first winding 210.

When the power supply circuit includes the comparison module 600, and the comparison module 600 includes the reference unit 610 and the feedback unit 620, the control module 400 may receive the feedback signal from the feedback unit 620 through the detection signal feedback terminal FB of the control chip U1.

In an embodiment, the control chip U1 further includes a temperature detection module connected to the control module, the temperature detection module is configured to detect the temperature of the control chip U1, and the control module is configured to turn off the switch module in response to that the temperature of the control chip exceeds a preset temperature. Specifically, the preset temperature may be set according to actual requirements.

In this case, the power supply circuit can be made to have an overheat protection function.

In an embodiment, the control chip U1 further includes a voltage detection module connected to the control module 400. The voltage detection module is configured to detect a power supply voltage of the control chip U1, and the control module 400 is configured to turn off the switch module 300 when the power supply voltage Vdd of the control chip U1 is beyond a preset voltage range, so that the power supply circuit has an overvoltage protection function.

Specifically, the preset voltage range may be between a first preset voltage and a second preset voltage. The first preset voltage is less than the second preset voltage. When the power supply voltage Vdd of the control chip U1 is smaller than the first preset voltage, or the power supply voltage Vdd of the control chip U1 is larger than the second preset voltage, the control module 400 turns off the switch module 300.

The first preset voltage and the second preset voltage may be set according to actual conditions. For example, the first preset voltage may be set to 14.5 V, and the second preset voltage may be set to 42 V. In this case, when the input power supply voltage Vdd is greater than 42 V, the flip-flop FF1 in the control chip U1 outputs a set signal 1, so that the flip-flop FF2 that controls the operation of the oscillation circuit has an output of 0, and the oscillation signal cannot be output. As such, The FET (switch module 300) in the control chip U1 does not operate.

When the input power supply voltage is less than 14.5 V, the voltage comparator within the control chip U1 may output a reset pulse such that the FET (switch module 300) within the control chip U1 does not operate.

In an embodiment, referring to FIG. 4, the transformer module 200 further includes a primary side second winding 230 configured to provide a power supply voltage to the control chip U1.

In an embodiment, referring to FIG. 4, the power circuit further includes an anti-shock module 700 having one end connected to the power supplying module 100 and the other end connected to the primary side first winding 210, and configured to provide a voltage releasing loop for the primary side first winding when the switch module 300 is turned off.

Specifically, referring to the FIG. 4, when the FET (switch module 300) inside the control chip U1 is turned off, a voltage greater than the first DC voltage Ui (e.g., a DC voltage of 300 V) may be generated across the primary side first winding 210 of the transformer module 200. The anti-shock module 700 is constituted by the resistor R2, the capacitor C4, and the diode D2, so that a releasing loop can be provided for the voltage on the primary side first winding 210.

In an embodiment, referring to the FIG. 4, the power supplying module 100 may include a first rectifying unit 110 and a first filtering unit 120. The first rectifying unit 110 may be connected to the mains and rectify the mains voltage. The first filtering unit 120 is connected to the first rectifying unit 110 and configured to filter a rectified voltage. The mains AC voltage can be converted to the first DC voltage Ui by the first rectifying unit 110 and the first filtering unit 120.

Specifically, the first rectifying unit 110 may include a rectification bridge DB1, and the first filtering unit 120 may include a filtering capacitor C3. Furthermore, referring to FIG. 4, the power supplying module 100 may further include an inductor LF1, a capacitor C2, a fuse F1, and the like. In this case, the mains 220 V AC power can be converted into the first DC voltage Ui having a value of 300 V through the power supplying module 100.

Of course, the configuration of the power supplying module 100 is not limited thereto. For example, the first rectifying unit 110 may also be connected to other AC voltage sources. Alternatively, the power supplying module 100 may be directly connected to a DC voltage source, which is not limited herein.

In an embodiment, referring to FIG. 4, the voltage conversion module 500 may include a second rectifying unit 510 and a second filtering unit 520. The second rectifying unit 510 configured to rectify a voltage on the secondary side winding. The second filtering unit 520 is connected to the second rectifying unit 510 and configured to filter the rectified voltage.

Specifically, the second rectifying unit 510 may include a rectifying diode D1. The second filtering unit 520 may include a filtering capacitor C6. In addition, the voltage conversion module 500 may further include a current limiting resistor R1, a filtering capacitor C1, and the like. Of course, it is to be understood that the form of the voltage conversion module 500 is not limited thereto.

In an embodiment, referring to FIG. 4, there is provided a power supply circuit including a power supplying module 100, a transformer module 200, a control chip U1, a voltage conversion module 500, a comparison module 600, and an anti-shock module 700.

The power supplying module 100 is configured to provide the first DC voltage Ui.

The transformer module 200 includes a primary side first winding 210, a secondary side winding 220, and a primary side second winding 230. The primary side first winding 210 is connected to the power supplying module 100, the secondary side winding 220 is coupled to the primary side first winding 210, and is connected to the voltage conversion module 500. The primary side second winding 230 is connected to the input terminal of the power supply voltage V DD of the control chip U1 to provide the power supply voltage Vdd to the control chip.

Referring to FIG. 1, the control chip U1 includes a switch module 300 and a control module 400. The switch module 300 is an FET within the control chip U1. The drain of the FET is connected to the primary side first winding 210, the source is connected to the ground terminal, and the gate is connected to the control module 400.

The control module 400 controls the switch module 300 to have different switching frequencies and/or different turning-off times such that first pulse voltages with different duty cycles are formed on the primary side first winding 210, and second pulse voltages with different duty cycles are subsequently generated on the secondary side winding 220.

The input terminal of the voltage conversion module 500 is connected to the secondary side winding 220, and the output terminal of the voltage conversion module 500 is connected to the voltage output terminal of the power supply circuit; and the voltage conversion module 500 is configured to convert the second pulse voltages with different duty cycles on the secondary side winding 220 into DC voltages.

The comparison module 600 includes a reference unit 610 and a feedback unit 620.

The reference unit 610 generates multiple reference voltages, and includes a reference power supply terminal and a voltage conversion sub-unit. The reference power terminal configured to provide a power supply to the reference unit 610. The voltage conversion sub-unit is connected to the reference power supply terminal, and configured to convert the power supply voltage provided from the reference power supply terminal into multiple reference voltages and output the multiple reference voltages to the feedback unit 620.

The feedback unit 620 includes an optocoupler device including a transmitter 621 and a receiver 622.

One end of the transmitter 621 is configured to receive the reference voltage provided from the reference unit 610. The other end of the transmitter 621 is connected to the output terminal of the voltage conversion module 500 through the current limiting resistor R5. The resistor R5 has a current limiting function, and prevents the DC voltage from the voltage conversion module 500 from being directly input to the transmitter 621, thereby preventing the transmitter 621 from being damaged by the excessive current.

Furthermore, an inductor L1 is provided between the output terminal of the voltage conversion module 500 and the voltage output terminal of the power supply circuit. The inductor L1 and the capacitor C5 constitute a filter circuit through which the DC voltage output from the voltage conversion module 500 can be output at the voltage output terminal, so that the DC voltage output from the voltage output terminal has lower ripples.

Specifically, the reference voltage generated by the reference unit 610 may be determined according to the voltage Uo1 formed after the various target voltages to be output at the voltage output terminal are divided by the inductor L1 and the resistor R5. More specifically, the reference voltage generated by the reference unit 610 may be set as a voltage Uo1 formed by voltage division of various target voltages to be output at the voltage output terminal through the inductor L1 and the resistor R5. Alternatively, in order to more accurately adjust the output voltage of the voltage output terminal, when the reference voltage generated by the reference unit 610 is set, the voltage drop caused by the transmitter 621 of the optocoupler device may be taken into account simultaneously.

Therefore, one end of the transmitter 621 is configured to receive the voltage Uo2 formed by voltage division of the actual voltage output from the voltage output terminal through the inductor L1 and the resistor R5, the other end is configured to receive the reference voltage provided by the reference unit 610, and then the voltage Uo2 and the reference voltage is compared, so that the comparison between the Uo2 (formed by voltage division of the actual voltage output from the voltage output terminal through the inductor L1 and the resistor R5) and Uo1 (formed by voltage division of the target voltage to be output from the voltage output terminal through the inductor L1 and the resistor R5, that is, the corresponding converted voltage obtained after the target voltage to be output from the voltage output terminal is subjected to the voltage conversion calculation) can be achieved, thereby achieving the comparison between various actual voltages output from the voltage output terminal and the respective target voltage.

The transmitter 621 transmits a related corresponding signal to the receiver 622 according to conditions of the Uo2 (formed by voltage division of the actual voltage output from the voltage output terminal through the inductor L1 and the resistor R5) and the reference voltage output by the reference unit 610. The receiver 622 receives the related signal from the transmitter 621 and transmits the related feedback signal to the control module 400.

Specifically, the receiver 622 is connected to the detection signal feedback terminal FB of the control chip U1, so that the related feedback signal is transmitted to the control module 400 through the detection signal feedback terminal FB. A current limiting resistor R7 may be specifically provided between the receiver 622 and the detection signal feedback terminal FB.

The control module 400 adjusts the switching frequency and/or the turning-off time of the switch module according to the feedback signal transmitted from the receiver 622 of the optocoupler device, and thus adjusts the voltage on the primary side first winding 210 of the transformer module 200, and adjusts the voltage on the secondary side winding 220 of the transformer module 200, so that the actual voltage output from the voltage output terminal is more accurate.

The anti-shock module 700 has one end connected to the power supplying module 100 and the other end connected to the primary side first winding 210. When the FET (switch module 300) inside the control chip U1 is turned off, a voltage greater than the first DC voltage Ui may be generated across the primary side first winding 210 of the transformer module 200, and the anti-shock module 700 may enable the voltage on the primary side first winding 210 to have a releasing loop.

In the description of this specification, description with reference to terms including "one embodiment", "other embodiments" means that a particular feature, structure, material, or characteristic described in combination with the embodiment or example is included in at least one embodiment or example of the present disclosure. In this specification, illustrative descriptions of the foregoing terms do not necessarily refer to the same embodiment or example.

Various technical features of the foregoing embodiments may be randomly combined. For conciseness of description, not all possible combinations of various technical features in the foregoing embodiments are described. However, as long as the combinations of these technical features do not contradict, they should be regarded as falling within the scope of the present specification.

The foregoing embodiments describe only a few implementations of the present disclosure, and the descriptions are specific and detailed, but cannot therefore be construed as limiting of the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

The invention claimed is:

1. A power supply circuit, comprising:
 a power supplying module, configured to provide a first direct current (DC) voltage, comprising: a first rectifying unit, configured to rectify a mains voltage; and a first filtering unit, connected to the first rectifying unit and configured to filter a rectified voltage;
 a transformer module, comprising a primary side first winding connected to the power supplying module and a secondary side winding coupled to the primary side first winding;
 a switch module having one end connected to the primary side first winding and the other end connected to a grounding terminal;
 a control module, connected to the switch module, wherein the control module is configured to control the switch module to have different switching frequencies and/or different turning-off times, to enable first pulse voltages with different duty cycles to be formed on the primary side first winding, and second pulse voltages with different duty cycles to be subsequently generated on the secondary side winding; and
 a voltage conversion module having an input terminal connected to the secondary side winding and an output terminal connected to a voltage output terminal of the power supply circuit, wherein the voltage conversion module is configured to convert the second pulse voltages with different duty cycles on the secondary side winding into respective DC voltages, and the voltage conversion module comprises a second rectifying unit, configured to rectify a voltage on the secondary side winding; and a second filtering unit, connected to the second rectifying unit and configured to filter a rectified voltage;
 an additional filter circuit, constituted by an inductor and a first capacitor, configured to lower a voltage ripper of a second DC voltage output from the voltage output terminal.

2. The power supply circuit of claim 1, comprising:
 a comparison module, connected to the voltage output terminal and the control module and configured to compare each actual voltage output from the voltage output terminal with a respective target voltage, and feedback a comparison result to the control module,
 wherein the control module is configured to adjust the switching frequency and/or the turning-off time of the switch module according to the comparison result.

3. The power supply circuit of claim 2, wherein the comparison module comprises:
 a reference unit, configured to generate a plurality of reference voltages, wherein each reference voltage is associated with a respective target voltage; and
 a feedback unit, connected to the voltage output terminal, the reference unit and the control module,
 wherein the feedback unit is configured to generate a feedback signal according to the actual voltage output from the voltage output terminal and the corresponding reference voltage generated by the reference unit, and the control module is configured to adjust the switching frequency and/or the turning-off time of the switch module according to the feedback signal.

4. The power supply circuit of claim 3, wherein the feedback unit comprises an optocoupler device comprising a transmitter and a receiver, two ends of the transmitter being respectively connected to the voltage output terminal and the reference unit, and the receiver being connected to the control module.

5. The power supply circuit of claim 3, wherein the reference unit comprises:
 a reference power supply terminal, configured to provide a power supply to the reference unit; and
 a voltage conversion sub-unit, connected to the reference power supply terminal and the feedback unit, and configured to convert the power supply voltage provided from the reference power supply terminal into a plurality of reference voltages and output the plurality of reference voltages to the feedback unit.

6. The power supply circuit of claim 5, wherein the voltage conversion sub-unit comprises a voltage regulator, a first resistor, a second resistor, a third resistor, and a second capacitor,
 wherein the voltage regulator has a control terminal connected to the feedback unit, a sampling terminal connected to the first resistor and the second resistor, and a grounding terminal;
 the first resistor has one end connected to the reference power supply terminal, and the other end connected to the sampling terminal of the voltage regulator;

the second resistor has one end connected to the sampling terminal of the voltage regulator, and the other end grounded;

the third resistor has one end connected to the control terminal of the voltage regulator, and the other end connected to the second capacitor; and the second capacitor has one end connected to the third resistor R8, and the other end connected to the sampling terminal of the voltage regulator.

7. The power supply circuit of claim 1, wherein the switch module comprises a switch transistor.

8. The power supply circuit of claim 1, wherein the switch module and the control module are disposed on a same control chip.

9. The power supply circuit of claim 8, wherein the control chip further comprises a temperature detection module connected to the control module, the temperature detection module being configured to detect a temperature of the control chip, and the control module being configured to turn off the switch module in response to that the temperature of the control chip exceeds a preset temperature.

10. The power supply circuit of claim 8, wherein the control chip further comprises a voltage detection module connected to the control module, the voltage detection module being configured to detect a power supply voltage of the control chip, and the control module being configured to turn off the switch module in response to that the power supply voltage of the control chip is beyond a preset voltage range.

11. The power supply circuit of claim 8, wherein the transformer module further comprises a primary side second winding configured to provide a power supply voltage to the control chip.

12. The power supply circuit of claim 1, further comprising:

an anti-shock module having one end connected to the power supplying module and the other end connected to the primary side first winding, and configured to provide a voltage releasing loop for the primary side first winding when the switch module is turned off.

13. The power supply circuit of claim 1, wherein the power supply circuit is configured to implement power supplying in a manner of single-input multiple-output to system platforms for testing a Dynamic Random Access Memory (DRAM).

* * * * *